United States Patent [19]

Matsuoka et al.

[11] Patent Number: 5,368,498
[45] Date of Patent: * Nov. 29, 1994

[54] SOCKET FOR RECEIVING ELECTRIC PART

[75] Inventors: Noriyuki Matsuoka, Yokohama; Masanori Egawa, Sendai, both of Japan

[73] Assignee: Yamaichi Electric Co., Ltd., Tokyo, Japan

[*] Notice: The portion of the term of this patent subsequent to May 17, 2011 has been disclaimed.

[21] Appl. No.: 115,565

[22] Filed: Sep. 3, 1993

Related U.S. Application Data

[63] Continuation of Ser. No. 876,461, Apr. 30, 1992, Pat. No. 5,312,267.

[30] Foreign Application Priority Data

Apr. 30, 1991 [JP] Japan ................................ 3-126697

[51] Int. Cl.⁵ ............................................. H01R 13/62
[52] U.S. Cl. .................................... 439/331; 439/487; 439/70
[58] Field of Search .................. 439/73, 92, 181, 108, 439/330, 331, 610, 736, 485, 487, 68–72; 361/381, 386, 388

[56] References Cited

U.S. PATENT DOCUMENTS

| | | | |
|---|---|---|---|
| 2,279,866 | 4/1942 | Ellinwood | 439/736 |
| 4,427,247 | 1/1984 | Petersen | 439/92 |
| 4,547,031 | 10/1985 | Korsunsky | 439/73 |
| 4,555,157 | 11/1985 | Johnson et al. | 439/76 |
| 4,582,384 | 4/1986 | Frantz et al. | 439/610 |
| 4,717,346 | 1/1988 | Yoshizaki | 439/331 |
| 4,758,176 | 7/1988 | Abe et al. | 439/72 |
| 5,046,967 | 9/1991 | Majernik et al. | 439/736 |
| 5,109,980 | 5/1992 | Matsuoka et al. | 439/73 |

*Primary Examiner*—Larry I. Schwartz
*Assistant Examiner*—Hien D. Vu
*Attorney, Agent, or Firm*—Wenderoth, Lind & Ponack

[57] ABSTRACT

A presser cover 2 is open- and closably connected to a socket body 1 through a pivotal hinge. A metal frame 13 is embedded in a synthetic resin frame 12 forming a heat discharging opening portion 10 in the presser cover 2. This metal frame 13 can be used as a bearing portion of the pivotal hinge, etc. and also as a static electricity discharging means.

2 Claims, 5 Drawing Sheets

SOCKET FOR RECEIVING ELECTRIC PART

This is a continuation application of Ser. No. 07/876,461, filed Apr. 30, 1992, now U.S. Pat. No. 5,312,267

BACKGROUND OF THE INVENTION

This invention relates to a socket for the use of an electric part, in which a cover is closed on a socket body so as to hold an electric part such as an IC and to maintain a contact relation.

Heretofore, there is known an IC socket, in which a presser cover is open- and closably connected to one end of a socket body through a pivotal hinge, and the presser cover is closed on the socket body and then a lock member mounted on the other end of the socket body is engaged with the other end of the presser cover, or a lock member mounted on the other end of the presser cover is engaged with the other end of the socket body, thereby holding the IC placed on the socket body. When the presser cover is closed on the socket body, IC leads are pushed down and urged against corresponding contacts on the socket body by a lead presser member mounted on the presser cover, thereby flexing the contacts against elasticity thereof in order to obtain a contact pressure by their reactions. An opening for discharging heat is formed in the presser cover at a location corresponding to an IC mounting portion (i.e., portion where the IC is placed).

The socket body and the presser cover, respectively, are formed of a separate integrally molded part of a synthetic resin material. The pivotal hinge comprises a metal shaft or the like, thrust into a knuckle joint integrally molded on one ends of the socket body and presser cover. The lead presser member comprises a pillow-like projection integrally formed on the presser cover in such a manner as to correspond to a row of the leads. Otherwise, a lead presser member having the pillow-like projection is formed as a separate part, and the same is disposed within the heat discharging opening and pivotably supported on a resin frame forming the opening.

This conventional IC socket has the following problem. That is, a push-up force is normally acted on the pressure cover by each of the contacts when the cover is closed on the socket body. Therefore, when the presser cover is subjected to a measurement test, etc. under the condition that the electric part is heated by, for example, the push-up force applied the presser cover, or under a high temperature, the cover is gradually warped during a repeated use thereof, by the push-up force and heat. Since the accuracy of the presser member becomes unreliable (that is, the presser member is subjected to error in accuracy), it becomes difficult to obtain a proper pushing pressure and a proper contact pressure for each of the IC leads.

It also has the problem that a socket of this type must be disposed as an article of consumption even if the socket body is still in a good condition for use, and therefore, the socket is very short in service life and thus uneconomical.

SUMMARY OF THE INVENTION

It is therefore an object of the present invention to provide, in order to solve the above problems, a socket for the use of an electric part, in which a resin frame forming a heat discharging opening portion in a presser cover is prevented from being warped.

To achieve the above object, a socket for the use of an electric part according to the present invention comprises a metal frame integrally embedded in a synthetic resin frame forming an opening portion in a presser cover and extending from a pivotal hinge side of the presser cover towards a free end side thereof.

The metal frame may be used as a bearing portion for the pivotal hinge or a presser member. Alternatively, the metal frame may be used as a means for discharging a static electricity.

When the presser cover is in its closed state, one end thereof is supported by the pivotal hinge and the other end (free end) thereof is supported by the lock member, as mentioned. In the foregoing state, the push-up force is applied to a central portion of the cover. As a result, the resin frame forming the opening portion in the presser cover is warped in a direction of both the pivotal hinge side and the free end side, and this warping becomes more significant when heat is applied thereto. However, since the metal frame is embedded in the resin frame and extending from the pivotal hinge side towards the free end side (these two sides are readily warped as mentioned), the warping in that direction can be prevented effectively. Therefore, there can be surely solved the above problems that the reliability with respect to the contact relation is lowered due to this warping and that the service life of the socket is short.

Furthermore, the metal frame, while being served as the means for preventing the warping of the resin frame, can also be effectively served as the bearing for the pivotal hinge and the pressure member, or as the means for discharging a static electricity.

DETAILED DESCRIPTION OF THE EMBODIMENTS

The present invention will now be described in the form of one preferred embodiment with reference to FIGS. 1 to 10.

Figure 1:
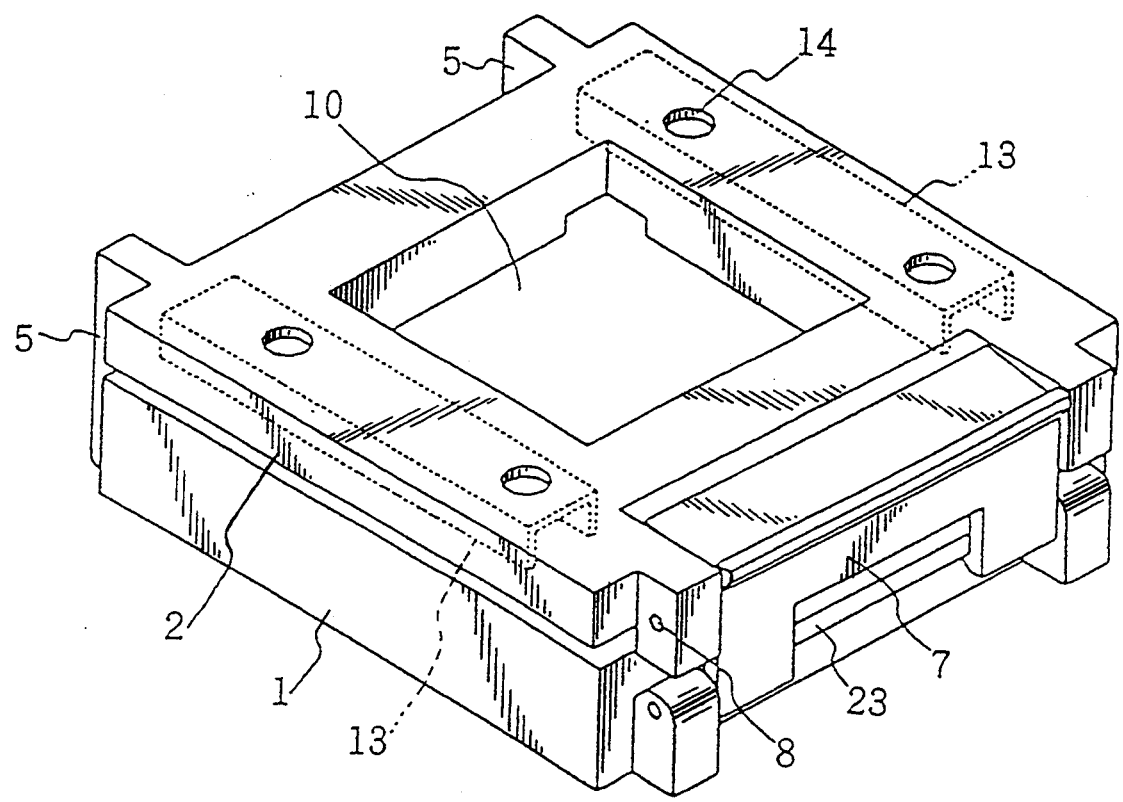
FIG. 1 is a perspective view of a socket for the use of an electric part showing a fundamental example of the present invention.
Figure 2:
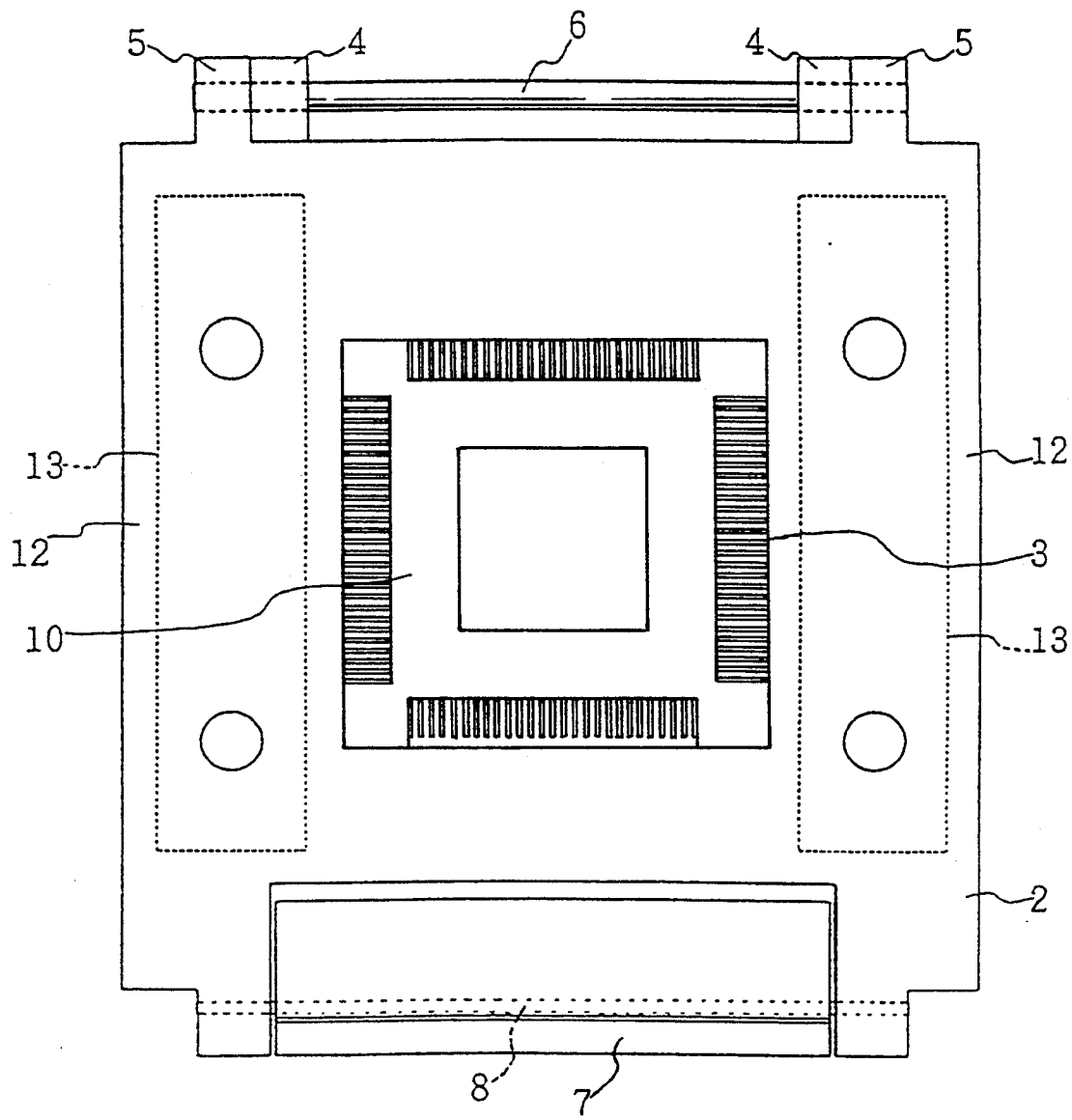
FIG. 2 is a plan view of the above
Figure 3:
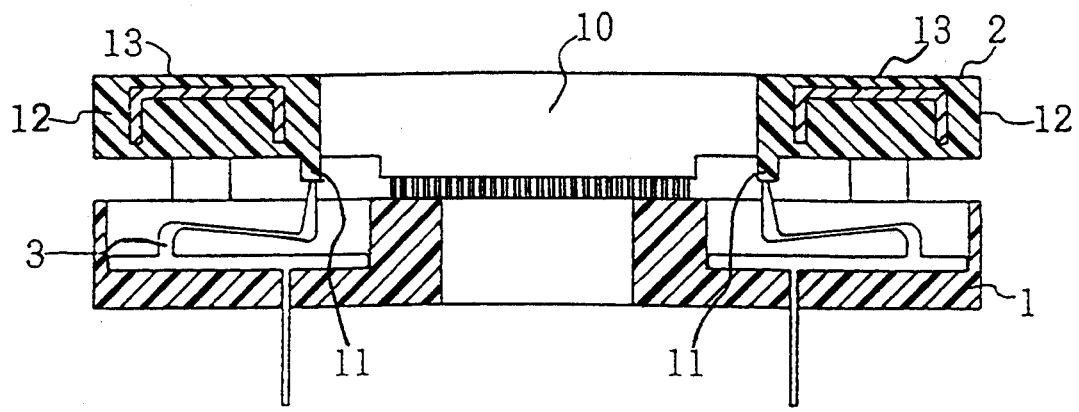
FIG. 3 is a sectional view of the above.
Figure 8:
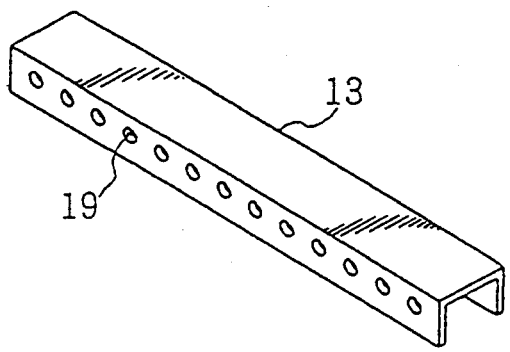
FIGS. 8 through 10 are perspective views respectively showing each example of metal frames.
Figure 9:
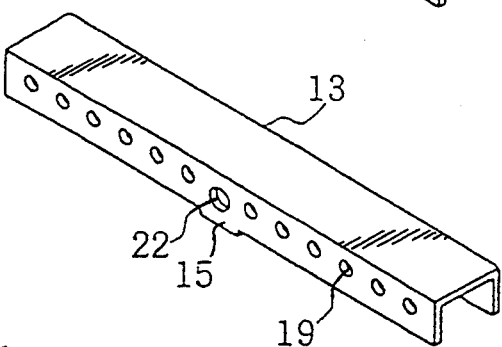
Figure 10:
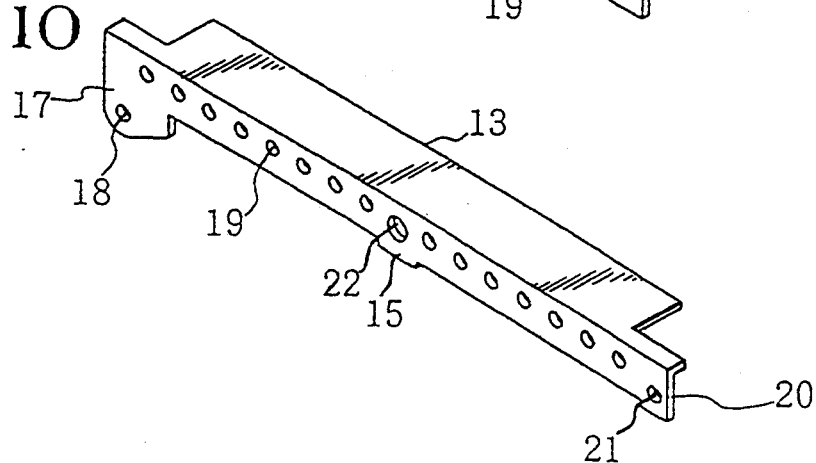

FIGS. 1 to 3 show a fundamental embodiment of a socket for the use of an electric part according to the present invention, and FIGS. 8 to 10 respectively show each example of metal frames to be used for the socket. First, a common construction of a first embodiment and a second embodiment will be described, and then a specific construction to each of them will be described.

The numeral 1 denotes a socket body having a plurality of contacts 3, and the numeral 2 denotes a presser cover. The presser cover 2 and the socket body 1 are integrally formed of synthetic resins, respectively. One end of the presser cover 2 is open- and closably connected to one end of the socket body 1 through a pivotal hinge. Joint portions 4 and 5 are integrally formed on one end of the socket body 1 and one end of the presser cover 2. The joint portions 4 and 5 are arranged in a staggered relation with each other, and a shaft 6 of a metal material is thrust into both of the joint portions 4 and 5, thereby forming the pivotal hinge.

The presser cover 2 is opened or closed with respect to the socket body 1 through the pivotal hinge. When the presser cover 2 is closed on the socket body 1, the cover pushes down leads (not shown) of the electric part placed on the socket body 1, and the leads, in turn, cause the corresponding contacts 3 downward against their elasticity, and a contact pressure is obtained between each of the contacts 3 and its corresponding lead by its reaction, thereby holding the electric part on the socket body 1.

Referring to a means for maintaining the closed state of the presser cover 2 and for holding the electric part, a lock member 7 is pivotably mounted on a free end of the presser cover 2 through a shaft 8, so that the same would be engaged with and disengaged from the other end of the socket body 1. Also, the lock member 7 is pivotably connected to the other end of the socket body 1, not shown, so that the lock member 7 would be engaged with and disengaged from the other end (free end) of the presser cover 2. A lock pin 23 for causing the engagement and the disengagement of the lock member 7 is disposed in a longitudinal direction of the other end of the socket body.

Figure 4:
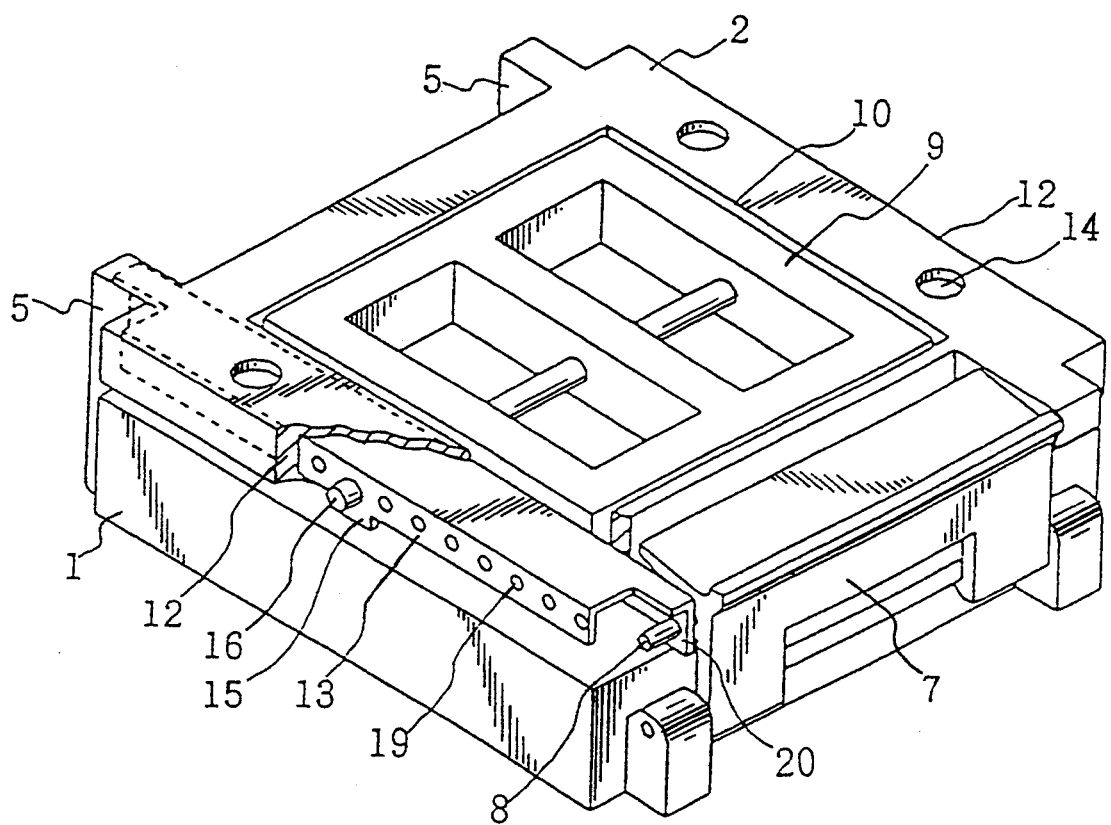
FIG. 4 is a perspective view, partly cut-away, of a modified embodiment in which other component parts are added to the fundamental constitution of FIG. 1.
Figure 5:
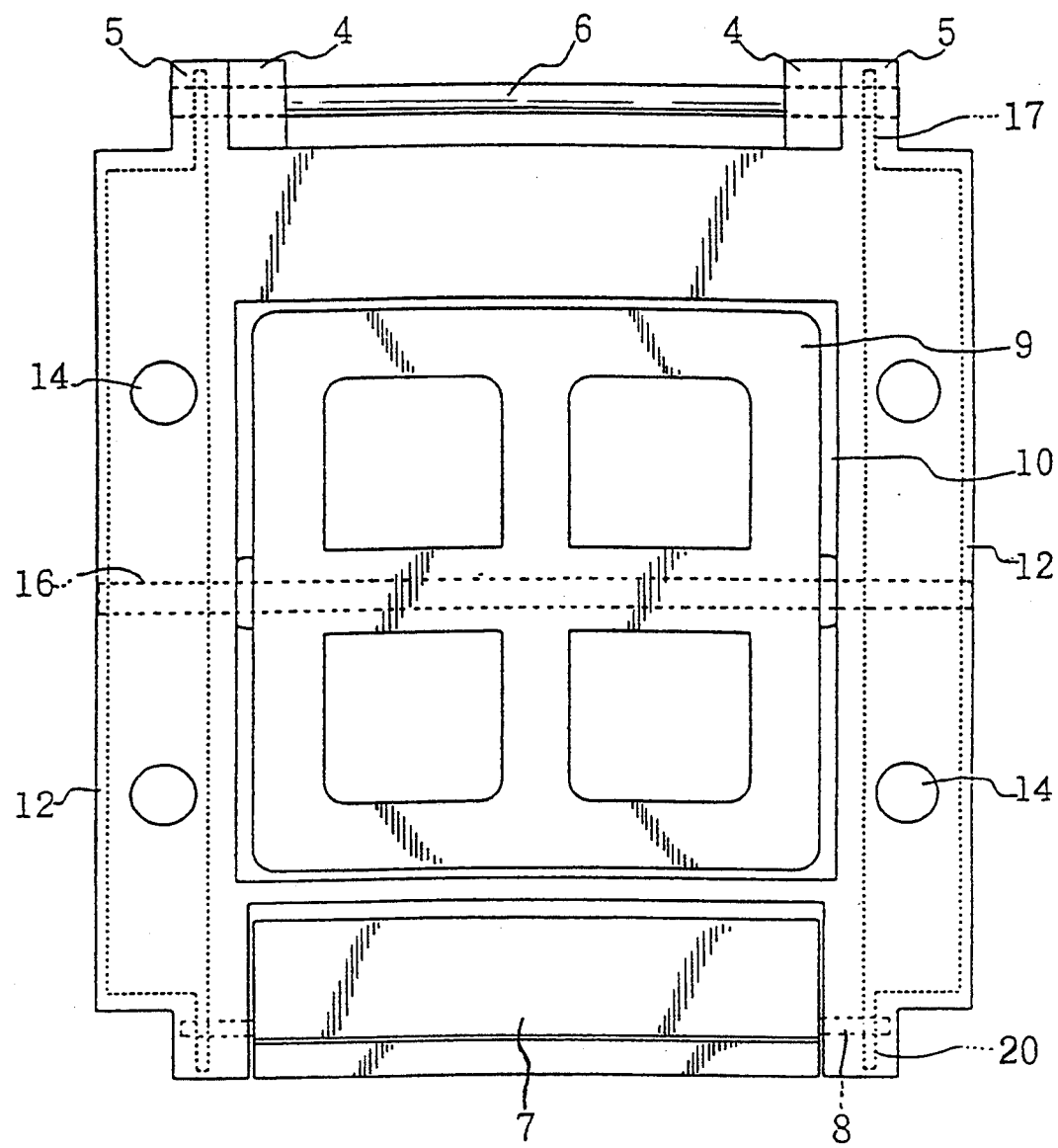
FIG. 5 is a plan view of the above.
Figure 6:
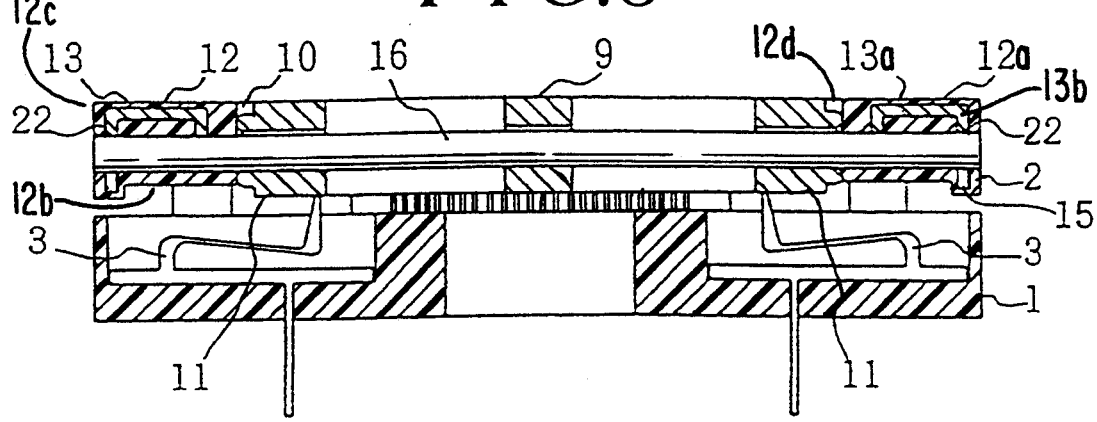
FIG. 6 is a cross sectional view of a bearing portion for a presser member of the above.
Figure 7:
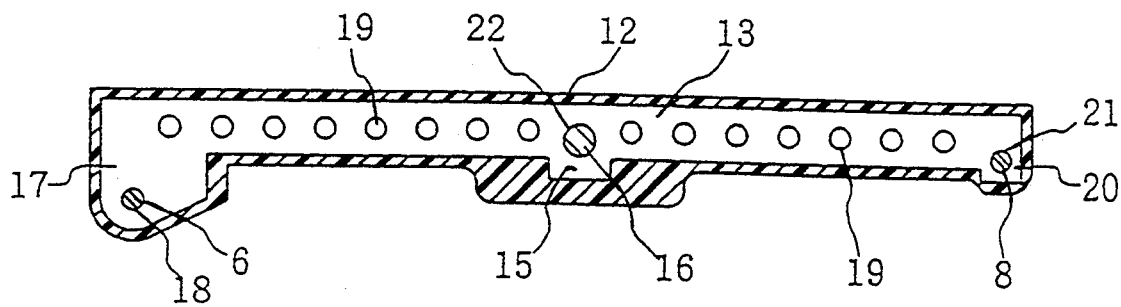
FIG. 7 is a vertical sectional view of a resin frame portion of the above.

The presser cover 2 is further provided with a presser member 9 for pushing or urging the leads against their corresponding contacts 3. As is shown in FIG. 3, a pillow-like projection 11 corresponding to the rows of the leads and contacts 3 is integrally formed on the mating surface (or closing surface) of the presser cover 2, so that the presser cover 2 itself would be served as the presser member. Alternatively, as shown in FIGS. 4 to 6, an opening 10 for the use of heat discharging is formed in the presser cover 2 in such a manner as to correspond to a portion of the socket body 1 where the electric part of the socket body 1 is placed, and the presser member 9 having the pillow-like projection 11 corresponding to the rows of the leads and contacts is formed of a different part from the presser cover 2, and the presser cover member 9 is pivotably mounted on an opposing resin frame 12 which forms the opening 10 in the presser cover 2.

A metal frame 13, as those shown in FIGS. 8 to 10, is integrally formed on each of opposing two sides of the resin frame 12 in such a manner as to extend from the pivotal hinge side thereof to the free end side thereof.

To form the metal frame 13, one piece of a U-shaped or L-shaped channel is disposed along an upper or lower surface of the resin frame 12, and the other piece thereof is disposed along an inner or outer surface of the resin film 2. The expression "lower surface" refers to the mating surface (or closing surface) of the presser cover 2, the expression "upper surface" refers to a surface opposite thereto, the expression "inner surface" refers to the inner surface of the opening portion 10, and the expression "outer surface" refers to a surface opposite thereto.

The metal frame 13, as illustrated, is completely embedded (or completely buried) in the resin frame 12, or partly embedded, by integral molding, therein with a remaining part thereof exposed from a surface thereof.

The expression "embedded" also includes such arrangements as that an outer surface of either one or the other piece of the metal frame 13 is exposed at both upper and lower surfaces or inner and outer surfaces of the resin frame 12.

In FIGS. 1 to 3, the metal frame 13 completely embedded in the resin frame 12 so that the same can be served as a core member of the resin frame 12. The resin frame 12 is provided with an exposing hole 14 opened up at a surface, e.g., upper surface, thereof, and the metal frame 13 is held in its exposed state in the hole 14.

In FIGS. 4 to 7, and also in FIGS. 9 and 10, a bearing portion 15 is disposed at a central portion of a side piece of the metal frame 13 disposed along the inner or outer surface thereof, and a bearing hole 22 is formed in this bearing portion 15 in order to support a metal shaft 16 of the presser member 9 disposed within the opening portion 10.

As shown in FIGS. 4, 5, 7 and 10, one end of the metal frame 13 is extended into the joint portion 5 of the pivotal hinge to form a bearing portion 17, a bearing hole 18 is formed in the bearing portion 17, and both ends of the metal shaft 6 forming the pivotal hinge of the presser cover 2 are carried on this bearing hole 18.

As shown in FIGS. 4, 5, 7, and 10, a bearing portion 20 is formed at the other end of the metal frame 13, and a bearing hole 21 is formed in this bearing portion 20, and the shaft 8, which supports the lock member 7, is disposed within the hole 21. The shaft 16, the shaft 6 of the presser member 9, and the shaft 8 of the lock member are directly carried in the bearing holes 18, 22, and 21, respectively, or indirectly carried therein through a resin material covering the inner peripheral surfaces of the bearing holes 18, 22, 21.

The metal frame 13 is provided with a number of connection holes 19, and a resin material is charged into the holes 19 in order to reinforce the connecting relation with respect to the resin frame 12. In the case where the shafts 6, 16 and 8 are formed of a metal material, respectively and these shafts are directly supported on the metal frame 13 for achieving a contacting relation, both the members (shafts and frame) are in conductive states with respect to a static electricity. Also, the exposing hole 14 can be used as a short hole, etc. for discharging the static electricity. The bearing portions 15, 17 and 20 can selectively be practiced either alone or in combination.

As described previously, there are such problems as that when the presser cover is closed on the socket body to cause the contacts against elasticity thereof, the reaction of these contacts is normally exerted to the presser cover as a push-up force, and as a result, the resin frame forming the opening portion in this presser cover is caused to be warped from the pivotal hinge side thereof toward the free end side thereof, thereby decreasing the reliability of the contact relation, and the socket is obliged to be discharged in a short period of time due to this warping.

Furthermore, this warping is further enhanced when heat of the electric part and a high temperature at the measuring time are applied to the resin frame. This warping is also occurred during the molding of the presser cover. According to the present invention, however, since the metal frame is embedded in the resin frame of the presser cover from the pivotal hinge side toward the free end side, a generation of the warping in that direction can be prevented effectively, thereby enabling to remove the above problems (i.e., warping caused by formation of the heat discharging opening portion and push-up force to be applied to each of the contacts). Accordingly, there can surely be solved the problem that the reliability of the contact relation is decreased and also the problem that the service life of the socket is decreased.

Furthermore, by virtue of the metal frame embedded in the resin frame, the same can be used as a bearing portion of a pivotal hinge, etc. of the presser cover, and also as a means for discharging a static electricity.

What is claimed is:

1. A socket for receiving an electric part, comprising:
a socket body of synthetic resin material;
a presser cover of a synthetic resin material;
hinge means hingedly connecting one end of said presser cover to one end of said socket body;
said presser cover having a synthetic resin frame defining an opening therethrough at a position corresponding to a portion where an electric part is to be placed on said socket body;
metal frames embedded only in parts of said synthetic resin frame and molded into the synthetic resin of each frame so as to be surrounded on all surfaces by synthetic resin, and extending from said one end having said hinge means thereon towards a free end of said synthetic resin frame, said metal frames extending past ends of said opening which are respectively toward said one end and said free end of said presser cover and into corner portions of said synthetic resin frame for reinforcing the corner portions of said synthetic resin frame; and
wherein said hinge means comprises a pair of spaced hinge supports on said one end of said presser cover, and a shaft extending between said hinge supports and supported on said socket body, one end portion of each of said metal frames at said one end of said presser cover extending into a corresponding hinge support and supporting said shaft in said hinge supports.

2. A socket for receiving an electric part, comprising:
a socket body of synthetic resin material;
a presser cover of a synthetic resin material;
hinge means hingedly connecting one end of said presser cover to one end of said socket body;
said presser cover having a synthetic resin frame defining an opening therethrough at a position corresponding to a portion where an electric part is to be placed on said socket body;
metal frames embedded only in parts of said synthetic resin frame and molded into the synthetic resin of each frame so as to be surrounded on all surfaces by synthetic resin, and extending from said one end having said hinge means thereon towards a free end of said synthetic resin frame, said metal frames extending past ends of said opening which are respectively toward said one end and said free end of said presser cover and into corner portions of said synthetic resin frame for reinforcing the corner portions of said synthetic resin frame; and
a presser member positioned within said opening in said presser cover and having a shaft on which said presser member is mounted, said shaft extending into said synthetic resin frame and being supported in said metal frames.

* * * * *